United States Patent
Xie et al.

(10) Patent No.: US 11,848,384 B2
(45) Date of Patent: Dec. 19, 2023

(54) SEMICONDUCTOR DEVICE WITH AIRGAP SPACER FORMATION FROM BACKSIDE OF WAFER

(71) Applicant: International Business Machines Corporation, Armonk, NY (US)

(72) Inventors: Ruilong Xie, Niskayuna, NY (US); Julien Frougier, Albany, NY (US); Kangguo Cheng, Schenectady, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 253 days.

(21) Appl. No.: 17/485,580

(22) Filed: Sep. 27, 2021

(65) Prior Publication Data
US 2023/0110073 A1    Apr. 13, 2023

(51) Int. Cl.
| | | |
|---|---|---|
| *H01L 29/94* | (2006.01) | |
| *H01L 29/76* | (2006.01) | |
| *H01L 29/78* | (2006.01) | |
| *H01L 21/8234* | (2006.01) | |
| *H01L 23/522* | (2006.01) | |
| *H01L 23/528* | (2006.01) | |
| *H01L 27/088* | (2006.01) | |
| *H01L 29/06* | (2006.01) | |
| *H01L 29/66* | (2006.01) | |

(52) U.S. Cl.
CPC .. *H01L 29/7851* (2013.01); *H01L 21/823431* (2013.01); *H01L 21/823481* (2013.01); *H01L 23/5226* (2013.01); *H01L 23/5283* (2013.01); *H01L 27/0886* (2013.01); *H01L 29/0649* (2013.01); *H01L 29/66795* (2013.01)

(58) Field of Classification Search
CPC ......... H01L 29/7851; H01L 21/823431; H01L 21/823481; H01L 23/5226; H01L 23/5283; H01L 27/0886; H01L 29/0649; H01L 29/66795; H01L 29/165; H01L 29/66545; H01L 29/7848; H01L 29/4991; H01L 29/6653; H01L 29/785
USPC ....................................................... 257/288
See application file for complete search history.

(56) References Cited

U.S. PATENT DOCUMENTS

| | | |
|---|---|---|
| 5,869,379 A | 2/1999 | Gardner et al. |
| 7,338,896 B2 | 3/2008 | Vanhaelemeersch et al. |
| 7,741,663 B2 | 6/2010 | Hause et al. |
| 9,460,958 B2 | 10/2016 | Purayath et al. |
| 9,735,246 B1 | 8/2017 | Basker et al. |
| 10,083,963 B2 | 9/2018 | Goktepeli et al. |
| 10,290,648 B1 | 5/2019 | Zhou et al. |
| 10,510,616 B2 | 12/2019 | Schroff et al. |
| 10,700,207 B2 | 6/2020 | Chen et al. |

(Continued)

FOREIGN PATENT DOCUMENTS

| | | |
|---|---|---|
| EP | 3324436 A1 | 5/2018 |
| WO | PCT/EP2022/075620 | 3/2023 |

*Primary Examiner* — Theresa T Doan
(74) *Attorney, Agent, or Firm* — Samuel Waldbaum; Ryan, Mason & Lewis, LLP

(57) ABSTRACT

A semiconductor structure includes a substrate and a field effect transistor disposed on the substrate. The field effect transistor includes a vertical fin, source and drain regions separated by a gate region, a gate structure disposed over the gate region and a gate airgap spacer at least partially disposed about the gate structure.

20 Claims, 13 Drawing Sheets

(56) References Cited

U.S. PATENT DOCUMENTS

| | | |
|---|---|---|
| 10,833,003 B1 | 11/2020 | Chou et al. |
| 10,985,064 B2 | 4/2021 | Zhang et al. |
| 2015/0243544 A1 | 8/2015 | Alptekin et al. |
| 2015/0255571 A1* | 9/2015 | Xu .................... H01L 29/4991 257/288 |
| 2018/0033863 A1 | 2/2018 | Xie et al. |
| 2020/0152504 A1 | 5/2020 | Frougier et al. |
| 2020/0303238 A1 | 9/2020 | Mannebach et al. |
| 2020/0411660 A1 | 12/2020 | Mannebach et al. |
| 2021/0028311 A1 | 1/2021 | Chen et al. |
| 2021/0134721 A1 | 5/2021 | Chiang et al. |
| 2021/0226033 A1 | 7/2021 | Huang et al. |

* cited by examiner

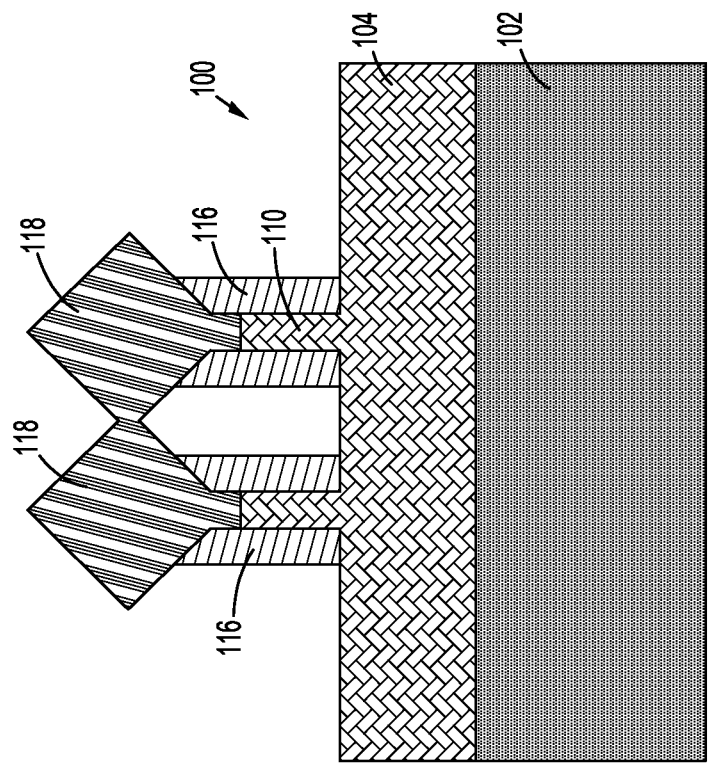
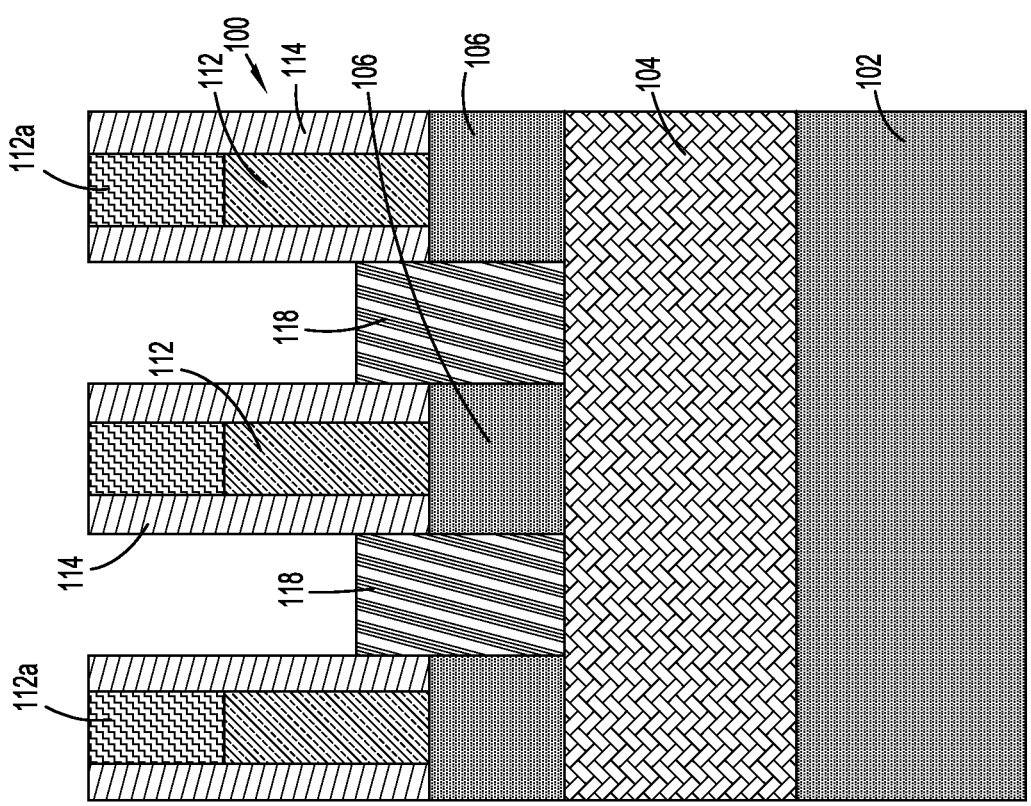

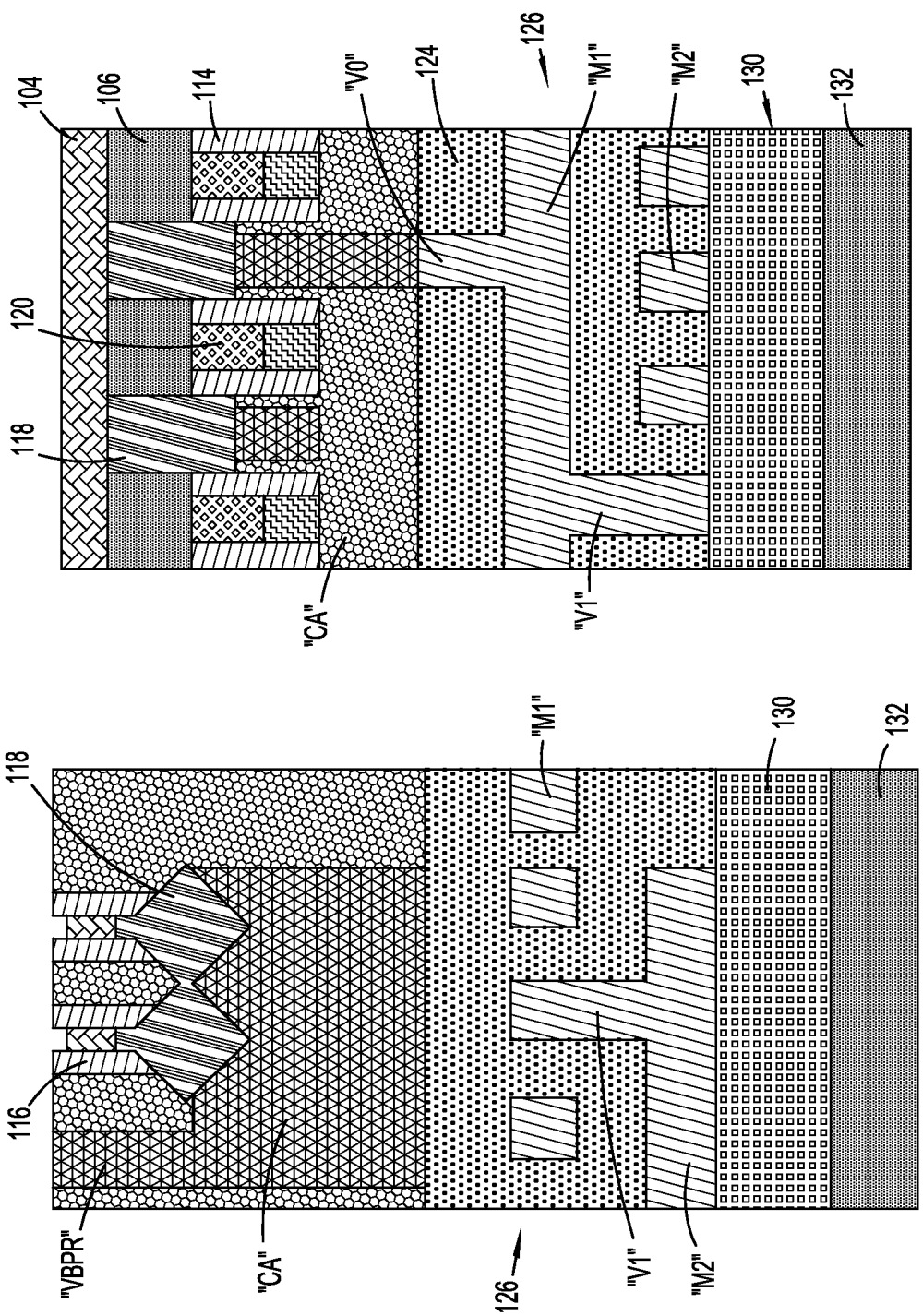

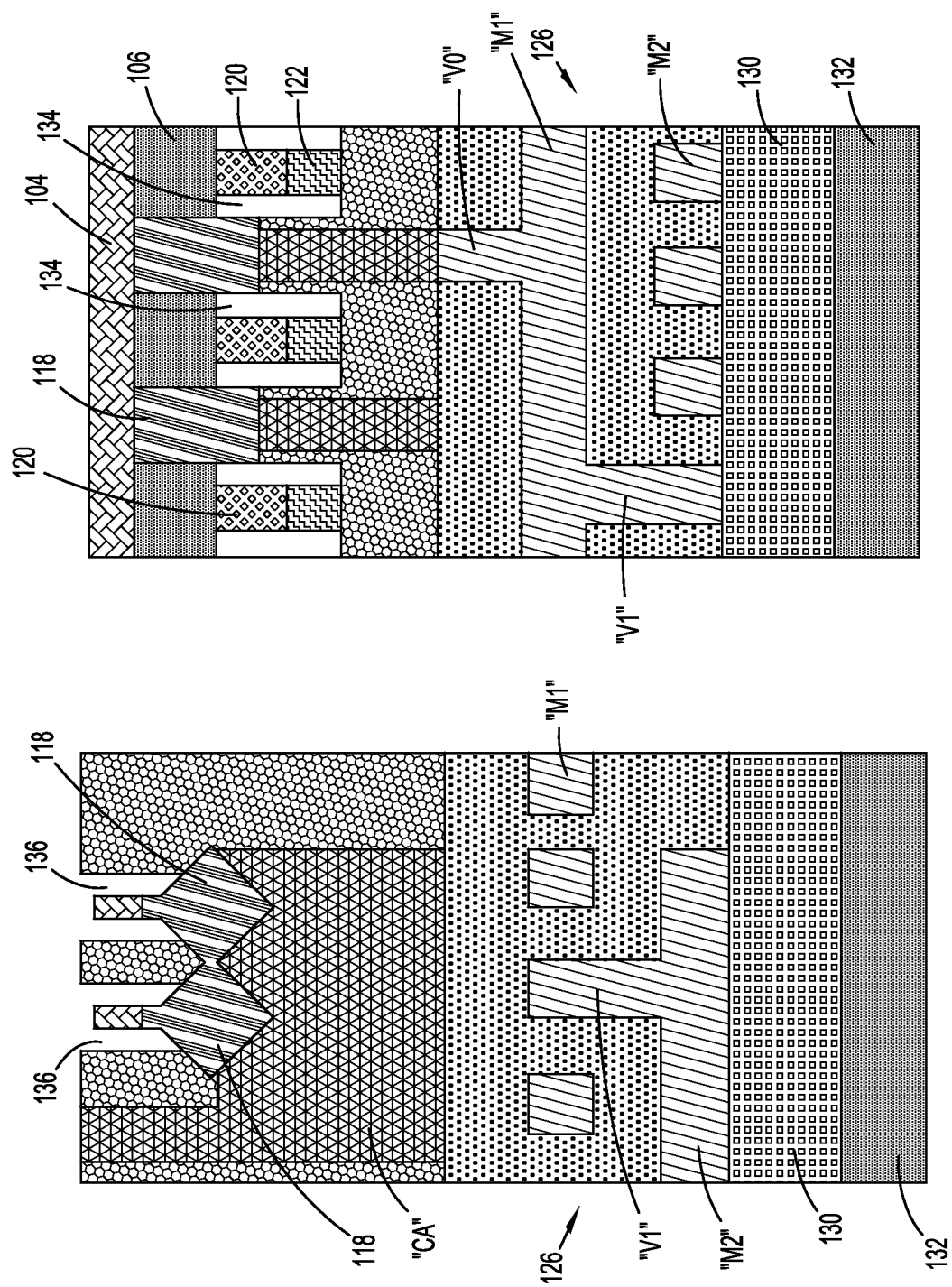

SEMICONDUCTOR DEVICE WITH AIRGAP SPACER FORMATION FROM BACKSIDE OF WAFER

BACKGROUND

As semiconductor manufacturing technologies continue to evolve toward smaller design rules and higher integration densities, integrated circuit devices and components become increasingly smaller, creating challenges in layout formation and device optimization. Currently, Fin field effect transistor (FinFET) technologies are typically implemented for FET fabrication, as such technologies provide effective complementary metal-oxide-semiconductor (CMOS) scaling solutions for FET fabrication at relatively small technology nodes. A FinFET device comprises a three-dimensional fin-shaped FET structure which includes at least one vertical semiconductor fin structure formed on a substrate, a gate structure formed over a portion of the vertical semiconductor fin, and source and drain regions formed from portions of the vertical semiconductor fin which extend from both sides of the gate structure. The portion of the vertical semiconductor fin that is covered by the gate structure between the source and drain regions comprises a channel region of the FinFET device.

However, the reduction in size of the various components of the FinFET device increases related parasitic characteristics which influence and sometimes determine application of these devices. For example, capacitance that may be found in the form of gate-to-source/drain play an even bigger role of impacting operational speed of a transistor, energy consumption of any integrated circuit (IC) that makes use of that transistor, and other aspects of performance. In general, gate-to-source/drain capacitance is affected, and determined, by the size of gate and source and drain epi/contact as well as characteristics of the dielectric material, represented typically by its dielectric constant, between the gate and the source and drain epi/contact. For example, in a typical FET, the dielectric material may include, among others, spacers at the sidewalls of the gate.

SUMMARY

Illustrative embodiments provide techniques for fabricating FET devices having airgap spacers in the transistor structure.

In an illustrative embodiment, a semiconductor structure comprises a substrate and a field effect transistor disposed on the substrate. The field effect transistor includes a vertical fin, source and drain regions separated by a gate region, a gate structure disposed over the gate region and a gate airgap spacer at least partially disposed about the gate structure.

In another illustrative embodiment, a semiconductor device comprises a substrate having first and second sides, a first device formed on the first side of the substrate and a second device formed on the second side of the substrate and coupled to the first device. The first device includes source and drain regions separated by a gate region, a fin, a gate structure disposed over the gate region, and an airgap spacer extending to the second side of the substrate.

In another illustrative embodiment, a method comprises forming a field effect transistor disposed on one side of a substrate where the field effect transistor includes a vertical fin, source and drain regions separated by a gate region and a gate structure disposed over the gate region, forming a gate airgap spacer at least partially disposed about the gate structure and forming a gate contact extending through the substrate in alignment with the airgap spacer and in contact with the gate structure.

These and other objects, features and advantages of the present disclosure will become apparent from the following detailed description of illustrative embodiments thereof, which is to be read in connection with the accompanying drawings.

BRIEF DESCRIPTION OF THE DRAWINGS

FIG. 5 is a schematic cross-sectional view along the x-axis of the semiconductor structure at a third intermediate stage of fabrication illustrating formation of the source and drain regions according to one or more illustrative embodiments.

FIG. 6 is a schematic cross-sectional view along the y-axis of the semiconductor structure at the third intermediate stage of fabrication according to one or more illustrative embodiments.

FIG. 11 is a schematic cross-sectional view along the y-axis of the semiconductor structure at a sixth intermediate stage of fabrication further illustrating removal of at least a portion of the oxide layer to expose the fin spacers.

FIG. 12 is a schematic cross-sectional view along the x-axis of the semiconductor structure at the sixth intermediate stage of fabrication according to one or more illustrative embodiments.

FIG. 13 is a schematic cross-sectional view along the y-axis of the semiconductor structure at a seventh stage of fabrication illustrating removal of the gate spacers and the fin spacers according to one or more illustrative embodiments.

FIG. 14 is a schematic cross-sectional view along the x-axis of the semiconductor structure at the seventh intermediate stage of fabrication according to one or more illustrative embodiments.

DETAILED DESCRIPTION

Figure 2:
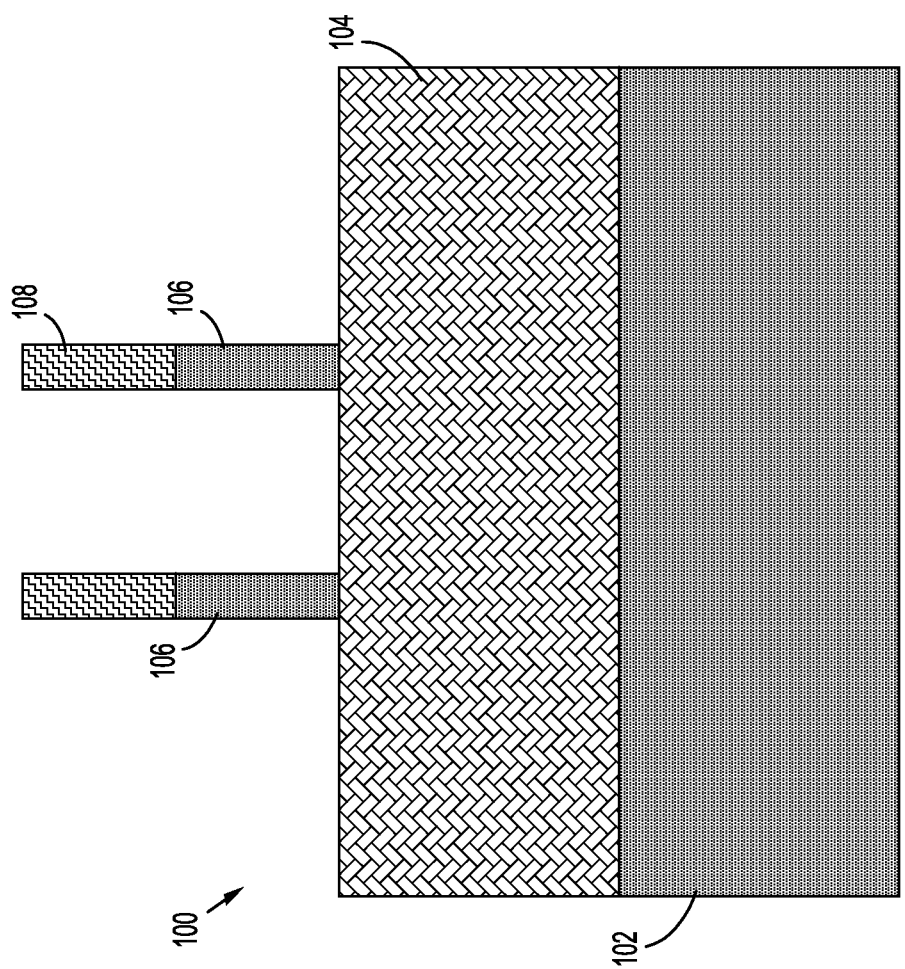
FIG. 2 is a schematic cross-sectional view along the y-axis of the semiconductor structure at a first intermediate stage of fabrication illustrating a semiconductor substrate, an oxide insulator or layer on the substrate and a vertical fin extending from the oxide layer according to one or more illustrative embodiments.

Illustrative embodiments of the disclosure will now be described with regard to methods for fabricating semiconductor substrates with uniform structural profiles, as well as semiconductor devices comprising one or more FinFETs. Semiconductor fabrication methods for FinFETs according to illustrative embodiments implement a process flow which forms airgap gate spacers and airgap fin spacers at the backside of the wafer or substrate.

The present disclosure generally relates to methods for forming one or more airgap spacers on a semiconductor device and the resulting device. As will be readily apparent to those skilled in the art upon a complete reading of the present application, the present method is applicable to a variety of products, including, but not limited to, logic products, memory products, etc. Moreover, the methods disclosed herein may be employed when manufacturing a variety of different transistor devices, e.g., planar devices, FinFET devices, nanowire devices, nanosheet devices etc. The present subject matter will be disclosed in the context of forming an integrated circuit product comprised of illustrative FinFET devices.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, e.g., film deposition, removal/etching, semiconductor doping, patterning/lithography and annealing steps, are purposefully not described in great detail herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" can include both an indirect "connection" and a direct "connection." The terms "on" or "onto" with respect to placement of components relative to the semiconductor structure are not to be interpreted as requiring direct contact of the components for it is possible one or more intermediate components, layers or coatings may be positioned between the select components unless otherwise specified. More specifically, positional relationships, unless specified otherwise, can be direct or indirect, and the present disclosure is not intended to be limiting in this respect.

As previously noted herein, for the sake of brevity, conventional techniques related to semiconductor device and integrated circuit (IC) fabrication may or may not be described in detail herein. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor structure including a FinFET device according to illustrative embodiments utilize a variety of individually known physical and chemical processes performed on a semiconductor (e.g., silicon) substrate, some of which are described in the immediately following paragraphs.

In the discussion that follows, the semiconductor structure, which will incorporate one or more FinFET devices, will be referred to as the "semiconductor structure 100" throughout the various stages of fabrication, as represented in all the accompanying drawings. In addition, the following discussion will identify various intermediate stages of fabrication of the semiconductor structure 100. It is to be understood that the intermediate stages are exemplative only. More or less intermediate stages may be implemented in processing the semiconductor structure, and the disclosed stages may be in a different order or sequence. In addition, one or more processes may be incorporated within various intermediate stages as described herein, and one or more processes may be implemented in intermediate stages as otherwise described herein.

Figure 1:
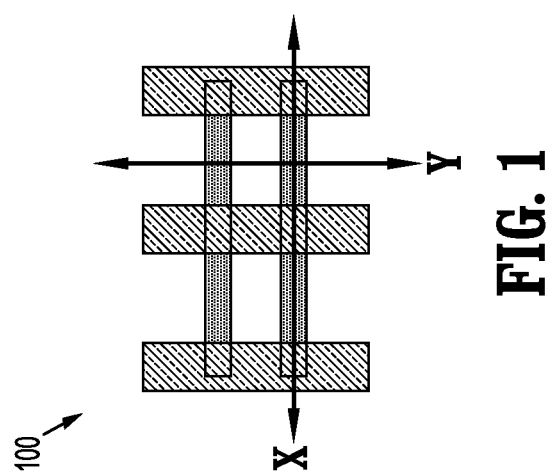
FIG. 1 is a top plan view of a semiconductor structure according to one or more illustrative embodiments.

With initial reference to FIGS. 1 and 2, there is schematically illustrated a semiconductor structure 100 at an early stage of fabrication. At this stage of fabrication, the semiconductor structure 100 comprises a semiconductor substrate 102 defining a first or longitudinal x-axis and a second or vertical y-axis in orthogonal relation to the longitudinal x-axis. The semiconductor structure further includes an isolation or oxide layer 104, one or more vertical fins 106 and a fin hardmask layer 108 disposed on the vertical fins 106.

The semiconductor structure 100 shown in FIG. 1 may be fabricated using known semiconductor fabrication techniques and suitable semiconductor materials. For example, the semiconductor substrate is illustrated as a generic substrate layer, and may comprise various structures and layers of semiconductor material. In one embodiment, the semiconductor substrate comprises a bulk semiconductor substrate (e.g., wafer) formed of, e.g., silicon (Si), or other types of semiconductor substrate materials that are commonly used in bulk semiconductor fabrication processes such as germanium (Ge), a silicon-germanium (SiGe) alloy or compound semiconductor materials (e.g., III-V or II-VI, etc.). Non-limiting examples of III-V compound semiconductor materials include gallium arsenide, indium arsenide, indium phosphide and indium gallium phosphide. In another embodiment, the semiconductor substrate comprises a SOI (silicon on insulator) substrate, which comprises an insulating layer (e.g., oxide layer) disposed between a base substrate layer (e.g., silicon substrate) and an active semiconductor layer (e.g., active Si or SiGe layer) in which active circuit components are formed as part of a FEOL (front end of line) structure.

In illustrative embodiments, the semiconductor structure 100 includes a semiconductor substrate or wafer 102 formed of silicon (Si) and an isolation layer or buried oxide (BOX) layer 104 disposed on the semiconductor substrate 102. The isolation or oxide layer 104 may be fabricated from any suitable oxide. At least one or more vertical fins 106 extend from the oxide layer 104 and include a fin hardmask layer 108. The vertical fins 106 and fin hardmask layer 108 can be fabricated using various known lithographic and etching methodologies. For example, a layer of silicon (Si) may be deposited or formed on the oxide layer 104 followed by deposition of a hardmask material on the layer of silicon. The hardmask material is patterned, and one or more etching processes are utilized to produce the vertical fins 106 with the fin hardmask layers 108. In one illustrative embodiment, the vertical fins 106 may be patterned from a crystalline SiGe layer that is epitaxially grown on top of a bulk silicon substrate or a bulk germanium substrate. A crystalline SiGe layer that is formed using an epitaxial growth process may comprise a relaxed SiGe layer or a strained SiGe layer. As is known in the art, strain engineering is utilized to enhance the carrier mobility for MOS transistors, wherein different types of Si—SiGe heterostructures can be fabricated to obtain and/or optimize different properties for CMOS FET devices. For example, silicon can be epitaxially grown on a SiGe substrate layer to form a strained Si layer. Moreover, a strained SiGe layer can be epitaxially grown on a silicon substrate layer. A strained-Si/relaxed-SiGe structure provides a tensile strain which primarily improves electron mobility for n-type FET devices, while a strained-SiGe/relaxed-Si structure provides a compressive strain which primarily improves hole mobility for p-type FET devices.

As used herein, a "fin" refers to a contiguous semiconductor material that includes a pair of vertical sidewalls that are parallel to each other. As used herein, a surface is "vertical" if there exists a vertical plane from which the surface does not deviate by more than three times the root mean square roughness of the surface. Each of a plurality of vertical fins 106 can comprise a single crystal semiconductor material that extends along a lengthwise direction along the longitudinal x-axis. A "widthwise direction" (W) is a horizontal direction that is perpendicular to the lengthwise direction along the y-axis.

Each fin hardmask layer 108 may be formed of any suitable material, e.g., a silicon nitride (SiN), that has an etch resistance greater than that of the semiconductor substrate 102 and at least some of the insulator materials used in the remainder of the processing of the semiconductor structure 100. The fin hardmask layer 108 is used to cover/protect vertical fin 106. As noted above, the fin hardmask layer 108 may be blanket deposited prior to forming the vertical fins 106 and etched via any suitable etching process.

Figure 3:
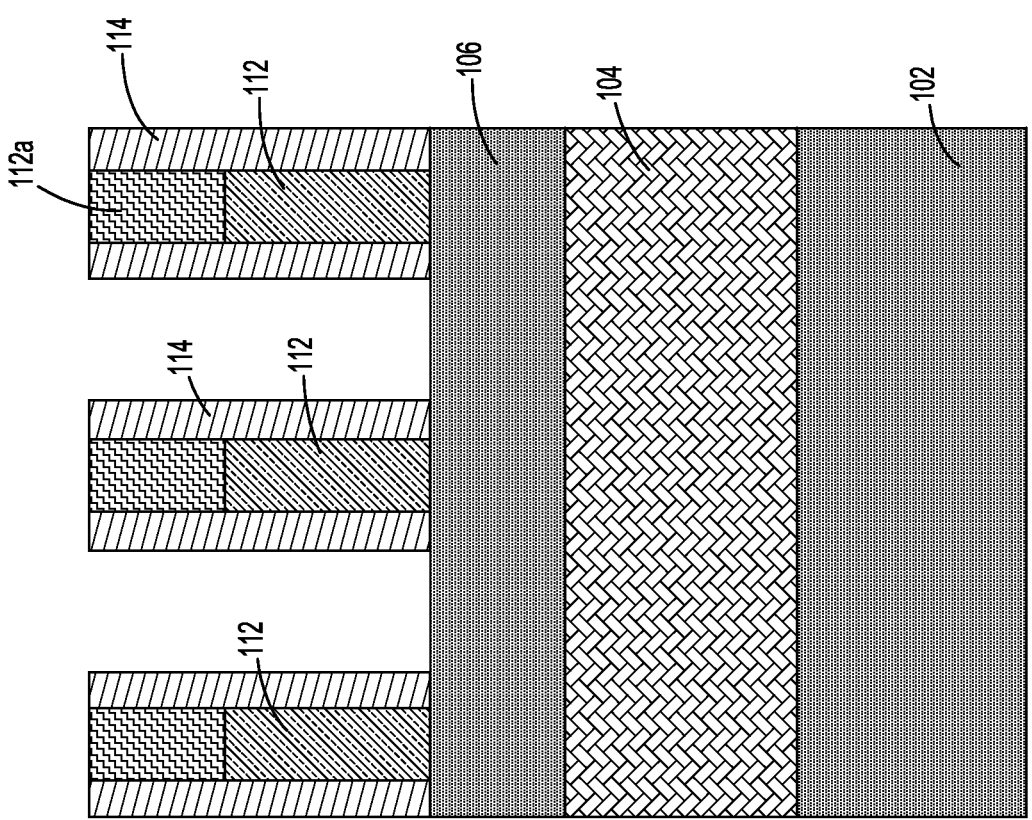
FIG. 3 is a schematic cross-sectional view along the x-axis of the semiconductor structure at a second intermediate stage of fabrication illustrating formation of the dummy gates, gate spacers and fin spacers according to one or more illustrative embodiments.
Figure 4:
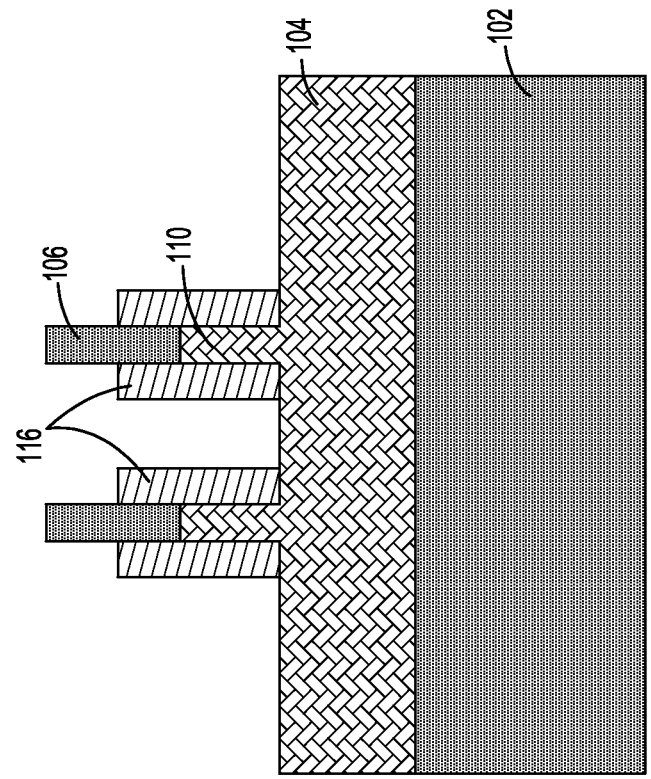
FIG. 4 is a schematic cross-sectional view along the y-axis of the semiconductor structure at the second intermediate stage of fabrication according to one or more illustrative embodiments.

Referring now to FIGS. 3 and 4, in a second intermediate stage of fabrication, the semiconductor structure 100 is subject to an etching process to remove an upper surface of the oxide layer 104 to thereby form a lower dielectric fin portion 110 comprising the material of the oxide layer 104. Thus, the vertical fin 106 includes a lower dielectric fin portion 110 formed of the material of the oxide layer 104 and a vertical semiconductor fin portion 106 which is disposed over the lower dielectric fin portion 110. For simplicity, hereinafter, the vertical fins will be referred to as vertical fins 106. However, in illustrative embodiments, the vertical fins 106 are inclusive of the lower dielectric fin portion 110. Any suitable directional etching process is envisioned. After fin patterning and etching of the oxide layer 104 is performed, the fin hardmask layer 108 is removed. Dummy gates 112 are formed using known process flows (e.g., by sequentially forming a dummy oxide layer and polysilicon layer and/or a polysilicon germanium over the substrate and patterning the layers to form the structure of the dummy gate structure). The dummy gates 112 surround the gate region of the vertical fins 106, i.e., encapsulating the top and vertical sides of each vertical fin 106. The dummy gates 112 may be subject to one or more etching processes. A hardmask layer 112a is deposited on each dummy gate 112. Thereafter, an outer gate spacer 114 is formed by depositing one or more layers of dielectric material, such as an oxide material including silicon oxide ($SiO_2$), hydrogenated silicon carbon oxide (SiCOH), silicon nitride, SiOCN, SiBCN, SiOC or other suitable low-k dielectric materials with a k-value less than 7 about the dummy gates 112.

Outer fin spacers 116 are also disposed about the vertical fins 106. The one or more layers of dielectric material forming the dummy gates 112, gate spacers 114 and fin spacers 116 can be deposited using plasma-enhanced chemical vapor deposition (PECVD), atomic layer deposition (ALD), or other suitable deposition methods which enable the deposition of thin films of dielectric material with high conformality. The gate spacers 114 and fin spacers 116 may be formed during the same deposition processes, and may be formed of the same material. After deposition of the material forming gate spacers 114 and fin spacers 116, an anisotropic etch process is performed to remove the horizontal portions of the spacer material, and the gate spacers 114 and fin spacers 116 are left at respective sidewalls of the dummy gates 112 and the vertical fins 106. The gate spacers 114 and fin spacers 116 are continuous at the intersection or corners of the dummy gates 112 and the vertical fins 106. The etching process of the vertical fins 106 into the oxide layer 104 to create the lower dielectric fin portion 110 facilitates exposure of the backside of the semiconductor structure 100 during subsequent processes.

With reference to FIGS. 5 and 6, in a third intermediate stage of fabrication, source and drain (S/D) regions 118 are formed on respective sides of the dummy gates 112 and the vertical fins 106. In one illustrative embodiment, the vertical fins 106 may be recessed via a suitable etching process. Thereafter, the source and drain regions 118 are formed by growing epitaxial semiconductor material on the exposed surfaces of the vertical fin 106 adjacent to the dummy gates 112 and the gate and fin spacers 114, 116. The type of epitaxial material and doping used to form the source and drain regions 118 will vary depending on whether the contemplated FinFET device is pFET or an nFET device. For example, for an nFET device, the source and drain regions 118 may comprise an n-doped epitaxial silicon (Si) material, and for a pFET device, the source and drain regions 118 may comprise a p-doped epitaxial silicon-germanium (SiGe) layer. In another embodiment, the source and drain regions 118 include silicide layers that are formed on tops or upper surfaces of the source and drain regions 118 using known methods. In other illustrative embodiments, the source and drain regions 118 may be formed via an ion implantation process(es). In one illustrative embodiment, the source and drain regions 118 may comprise N-type or P-type dopant atoms, formed by introducing dopant atoms via conventional methodologies.

Figure 8:
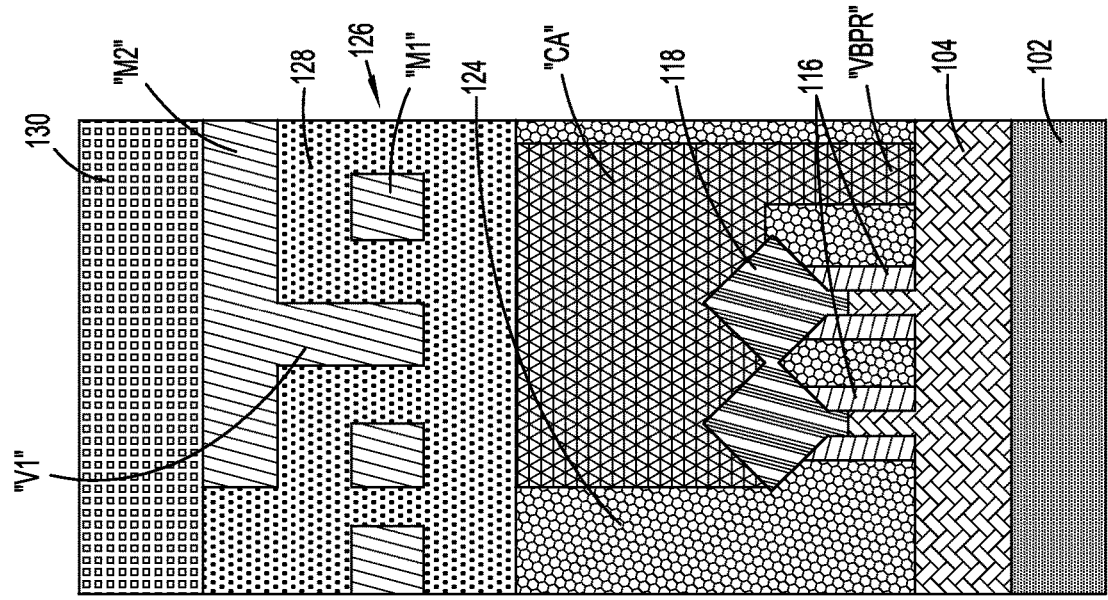
FIG. 8 is a schematic cross-sectional view along the y-axis of the semiconductor structure at the fourth intermediate stage of fabrication according to one or more illustrative embodiments.
Figure 7:
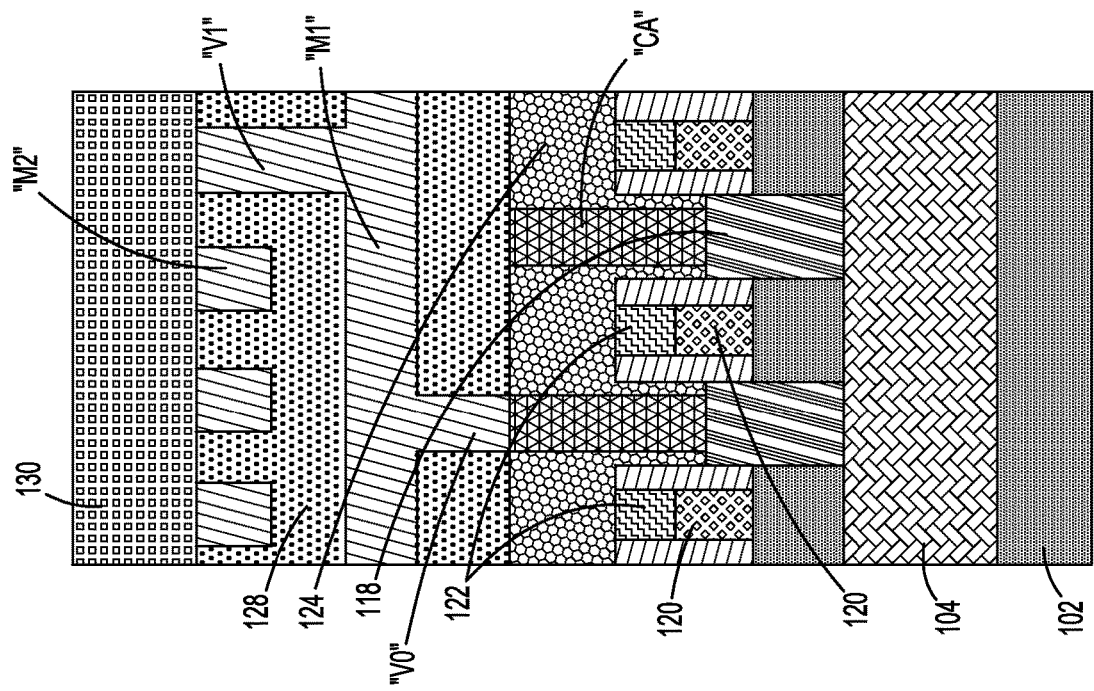
FIG. 7 is a schematic cross-sectional view along the x-axis of the semiconductor structure at a fourth intermediate stage of fabrication illustrating formation of the gate structures and one or more BEOL devices on the semiconductor substrate according to one or more illustrative embodiments.

With reference to FIGS. 7 and 8, representing a fourth intermediate stage of fabrication, the dummy gates 112 and hardmask layers 112a are removed and replaced with active gate structures. In one illustrative embodiment, the hardmask layers 112a are removed by an interlayer dielectric (ILD) chemical-mechanical planarization (CMP) process to expose the dummy gate 112, and then the dummy gates 112 are removed by one or more selective dry or wet etch processes. A gate structure 120 is formed in place of the removed dummy gates 112. In illustrative embodiments, a conformal high-k liner and a gate metal are deposited into the areas vacated by the removed dummy gates. The high-k liner may comprise a high-k dielectric material having a dielectric constant of about 3.9 or greater, such as HfO2. The gate metal may be formed by depositing a conductive material including, but not limited to titanium nitride (TiN), titanium aluminum nitride (TiAlN), titanium carbide (TiC), titanium aluminum carbide (TiAlC), and/or combinations thereof. Other suitable materials include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of such conductive materials. The gate structure 120 may be subjected to an etching and/or planarization process to be beneath the gate spacer. Thereafter, a self-aligned contact (SAC) cap 122 is deposited on each gate structure within the gate spacer. The SAC cap 122 protects the gate structure during subsequent fabrication processes.

With continued reference to FIGS. 7 and 8, formation of the semiconductor structure 100 is continued by depositing a dielectric layer 124 onto the semiconductor structure 100 over the vertical fins 106 and the gate structure 120. The dielectric layer 124 may comprise any dielectric material including, for example, oxides, nitrides or oxynitrides. In one embodiment, the dielectric layer 124 includes silicon dioxide. The dielectric layer 124 may be formed, for example, by chemical vapor deposition (CVD) or spin-coating. In various embodiments, the dielectric layer may be self-planarizing, or the top surface of the dielectric layer 124 can be planarized by chemical mechanical planarization (CMP).

Following the formation of the gate structures 120 (e.g., metallic gate structures) and deposition of the dielectric layer 124, any suitable sequence of processing steps can be implemented to complete the fabrication of the semiconductor structure 100, the details of which are not needed to understand embodiments of the invention. For example, one or more gate contacts "CB" (not shown) and source and drain contacts "CA" may be formed in the dielectric layer 124 contacting the respective gate structures 120 or source/drain regions 118. A via backside power rail (VBPR) contact is also formed to wire out the epitaxial material of the source and drain regions 118 or the source and drain contact CA down below the bottom surface of the epitaxial material of the source and drain regions 118, into the BOX or oxide layer 104. Thereafter, a BEOL (back end of line) interconnect device 126 is formed on the dielectric layer 124 using well known fabrication process flows, connections between the FinFET devices and other active or passive devices that are formed as part of the FEOL layer.

The BEOL process includes deposition of one or more interconnect levels, one or more metallization layers and formation of vias interconnecting the one or more interconnect levels. In illustrative embodiments, the BEOL structure includes multiple metallization levels M1, M2 and vias V0, V1. In illustrative embodiments, one via V0 is in contact with a designated source and drain contact CA. The vias V0, V1 are formed by etching openings in the ILD layer 128 of the BEOL interconnect device 126 and then filling the openings with a conductive material to establish contact with contacts of the underlying semiconductor structure.

Figure 10:
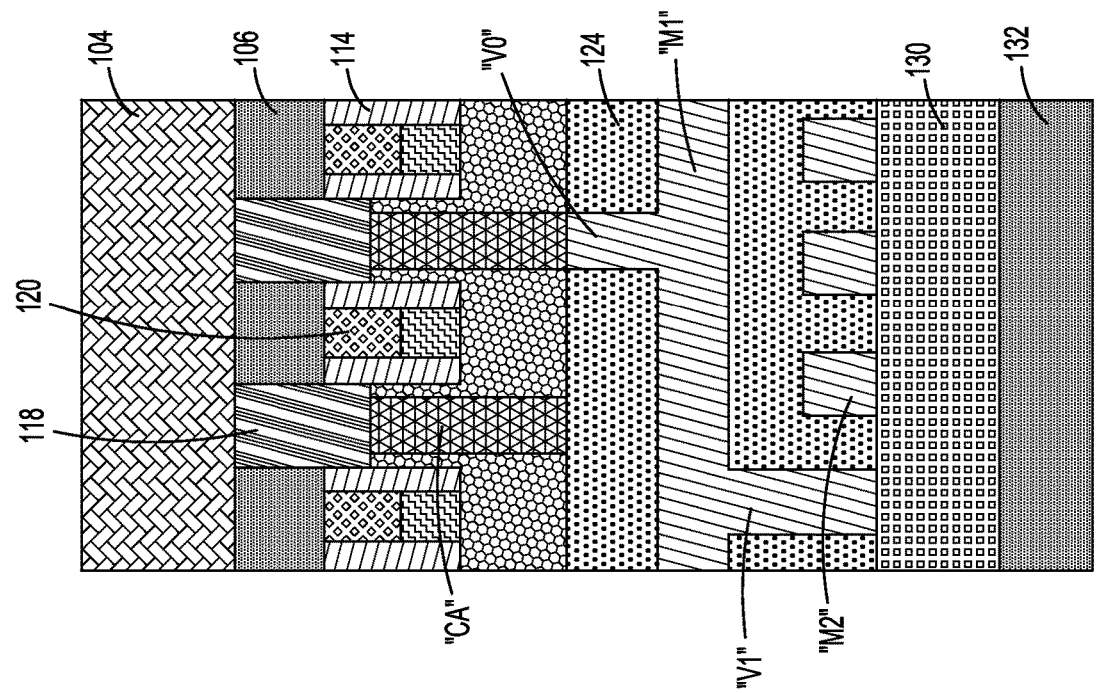
FIG. 10 is a schematic cross-sectional view along the x-axis of the semiconductor structure at the fifth intermediate stage of fabrication according to one or more illustrative embodiments.
Figure 9:
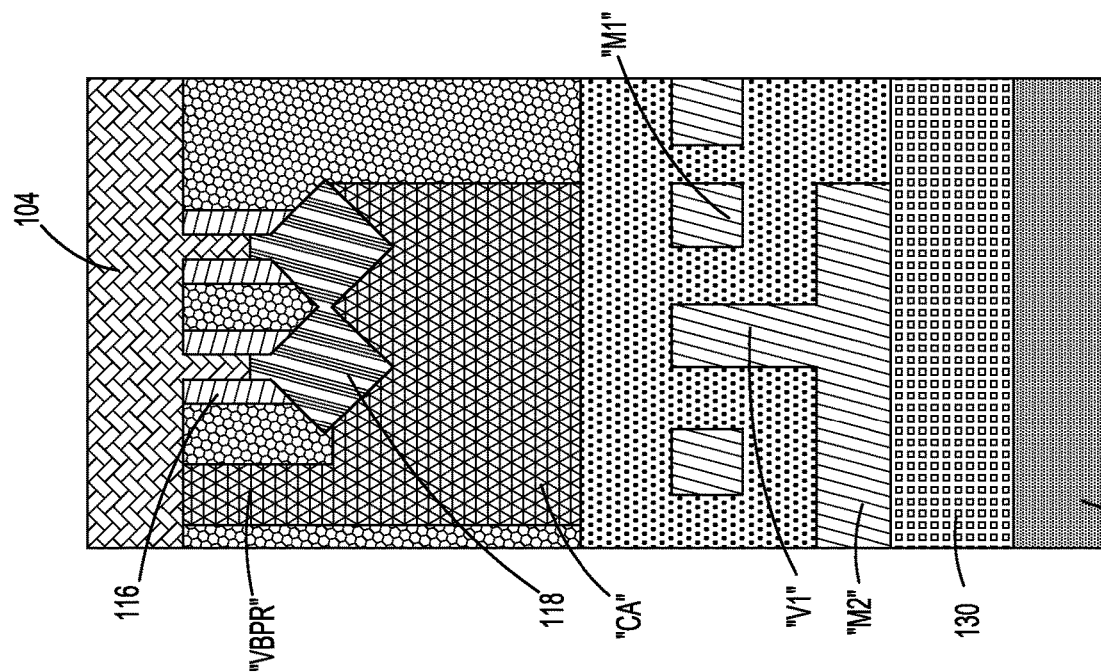
FIG. 9 is a schematic cross-sectional view along the of the semiconductor structure at a fifth intermediate stage of fabrication illustrating rotation of the semiconductor structure, removal of the semiconductor substrate and bonding of a second wafer to the BEOL devices according to one or more illustrative embodiments.

In addition, or as an option, one or more one or more additional BEOL devices 130 are formed on top of the BEOL interconnect device 126. Referring now to FIGS. 9 and 10, representing a fifth stage of fabrication, a carrier wafer (or handler wafer) 132 is bonded to the upper surface of the outermost BEOL device 130, by conventional wafer bonding processes, such as oxide-oxide bonding. Subsequent, or prior to bonding of the carrier wafer 132, the semiconductor structure 100 is rotated 180°. The carrier wafer 132 may be substantially similar to the semiconductor substrate 102 described hereinabove. In addition, the original semiconductor substrate 102 is removed via one or more removal processes including, for example, a Si grinding process, followed by chemical mechanical planarization (CMP) and a selective etching process to remove all of the Si semiconductor substrate 102 and stopping on the oxide layer or BOX 104.

Referring now to FIGS. 11 and 12, representing a sixth stage of fabrication, the oxide layer 104 is reduced in thickness sufficient to expose the fin spacers 116 around the gate structures 120 while maintaining a reduced portion of the oxide layer 104 on the semiconductor substate. As best depicted in FIGS. 13 and 14, representing a seventh stage of fabrication the exposed fin spacers 116 and gate spacers 114 are removed via one or more etching process selective to surrounding materials of the semiconductor structure 100 thereby leaving voids about the gate structures 120 and the vertical fins 106. These voids eventually form gate and fin airgap spacers 134, 136 respectively about the gate structures 120 and the vertical fins 106.

Figure 15:
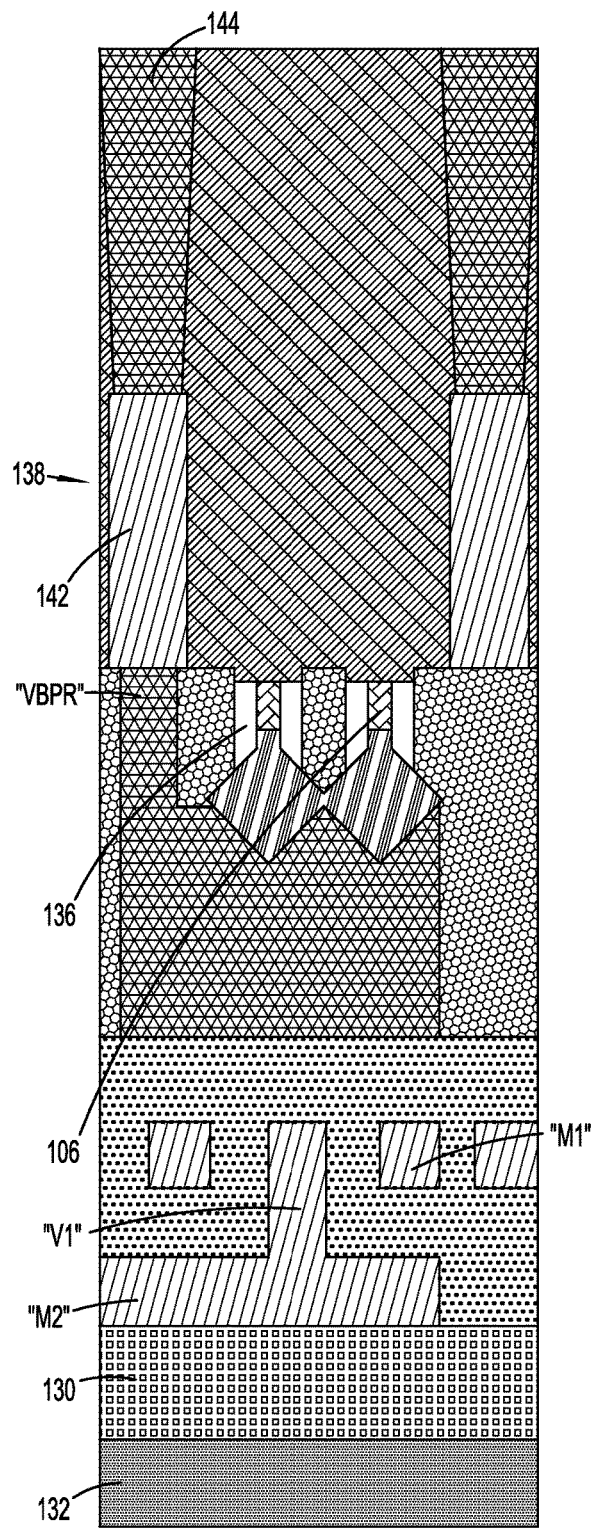
FIG. 15 is a schematic cross-sectional view along the y-axis of the semiconductor structure at an eighth intermediate stage of fabrication illustrating formation of a power distribution network on the remaining portion of the oxide layer.
Figure 16:
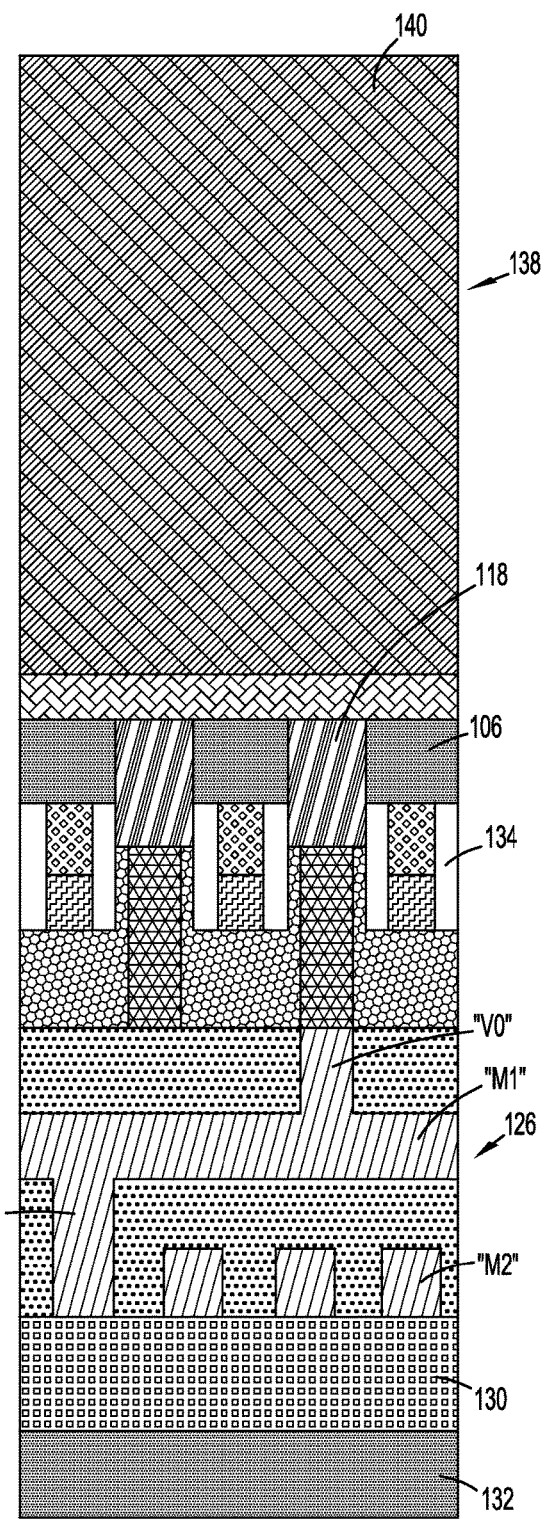
FIG. 16 is a schematic cross-sectional view along the x-axis of the semiconductor structure at the eight intermediate stage of fabrication according to one or more illustrative embodiments.

Referring now to FIGS. 15 and 16, representing an eighth intermediate stage of fabrication, a power distribution network 138 is formed on the back surface of the oxide layer 104. More specifically, a backside interlayer dielectric (backside ILD) material is deposited on the underside of the semiconductor structure, i.e., on the remaining portion of the oxide layer 104 to form a backside ILD 140. The backside ILD 140 can be an oxide, with a low-k dielectric (with k value<3.9). The selected material for the backside ILD 140 exhibits poor gap-fill ability thereby leaving the voids, i.e., the gate and fin airgap spacers 134, 136 around the gate structures 120 and the vertical fins 106, respectively, in place, i.e., devoid of the dielectric material. The fabrication of the power distribution network 138 may be completed by building one or more backside power rail(s) (BPR) 142 and one or more via contacts 144 into the backside ILD 140. Any conventional processes for forming these structures are envisioned. As illustrated, the semiconductor structure 100 includes a via BPR (VBPR) which contacts and electrically connects with the BPR 142 of the power distribution network 138. On top of via contacts, additional backside metal lines can be built (not shown).

Thus, the methodology provides a semiconductor device having gate and fin airgap spacers 134, 136 around the gate structures 120 and the vertical fins 106. The gate airgap spacer 134 is in direct alignment with a gate contact because when the gate contact is formed at the frontside of the wafer, the airgap does not exist, and therefore there is no concern about migration of the metal into the airgap during gate contact formation. The fin airgap spacer 136 extends to the back side of the remaining substrate.

Figure 17:
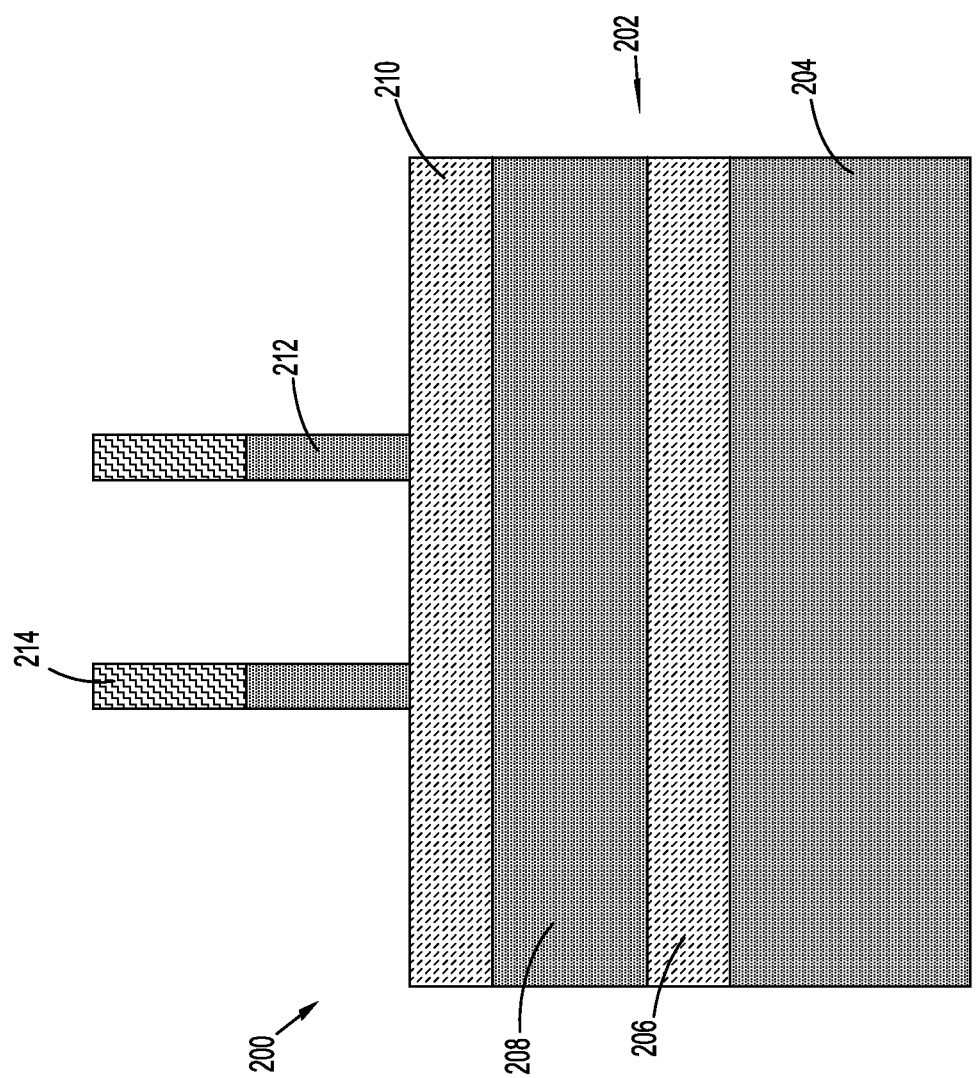
FIG. 17 is a schematic cross-sectional view along the y-axis of another illustrative embodiment of the semiconductor structure at a first intermediate stage of fabrication illustrating a semiconductor substrate, an oxide layer on the substrate, additional layers of silicon and silicon germanium and vertical fins according to one or more illustrative embodiments.

Referring now to FIG. 17, an alternate methodology and semiconductor structure in accordance with an illustrative embodiment of the present disclosure is depicted. In accordance with this illustrative embodiment, the semiconductor structure 200 includes a semiconductor substrate 202 having a first substrate level 204 formed of silicon, a second substrate level 206 of silicon germanium, a third substrate level 208 formed of silicon and a fourth substrate level 210 formed of silicon germanium. Each of the levels 204, 206, 208, 210 may be made via conventional deposition, planarization and etching processes. One or more vertical fins 212 extend from the semiconductor substrate 202. A hardmask 214 is formed on each vertical fin 212.

Figure 18:
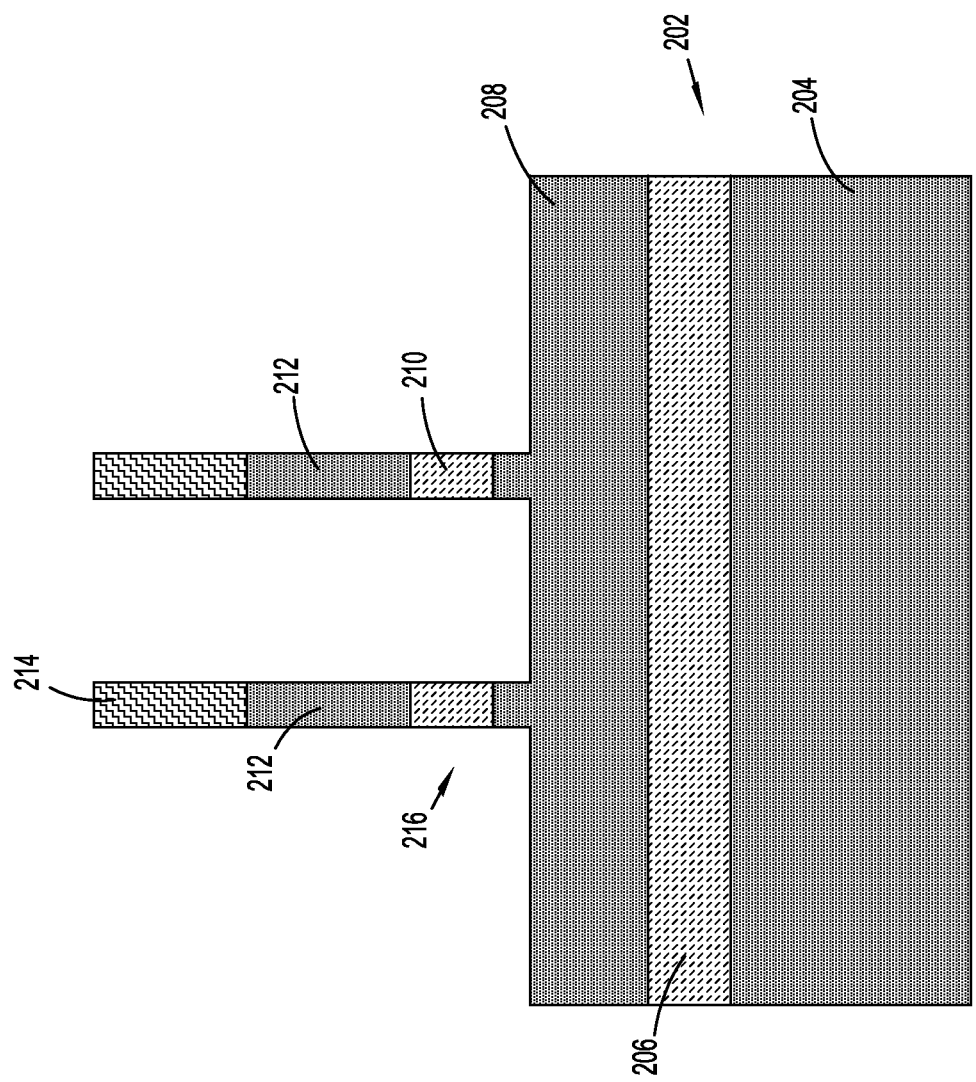
FIG. 18 is a schematic cross-sectional view along the y-axis of the semiconductor structure of FIG. 17 at a second stage of fabrication illustrating recessing of the semiconductor substate to extend the vertical fins into at least an underlying silicon germanium layer.

With reference to FIG. 18, through one or more etching processes, the portions of the fourth substrate level 210 and the third substrate level 208 are removed via conventional lithographic and etching processes to extend the vertical fins 212 into the semiconductor substrate, i.e., to form a lower fin portion 216 inclusive of the silicon germanium material of the fourth substrate level 210 and the silicon material of the third substrate level 208.

Figure 20:
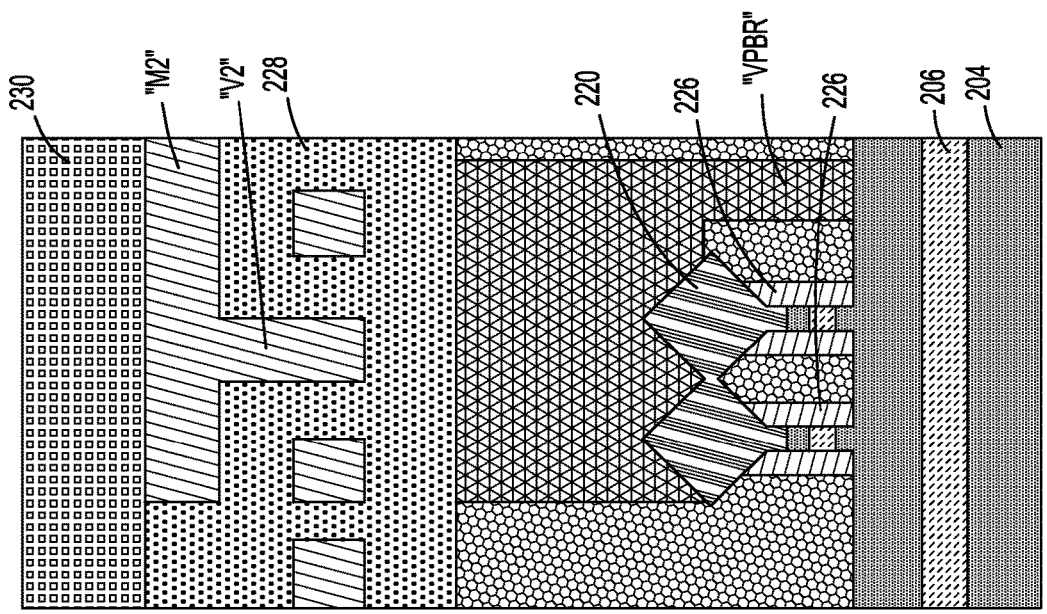
FIG. 20 is a schematic cross-sectional view along the y-axis of the semiconductor structure of FIGS. 17-19 at the third intermediate stage of fabrication illustrating formation of the fin spacers according to one or more illustrative embodiments.
Figure 19:
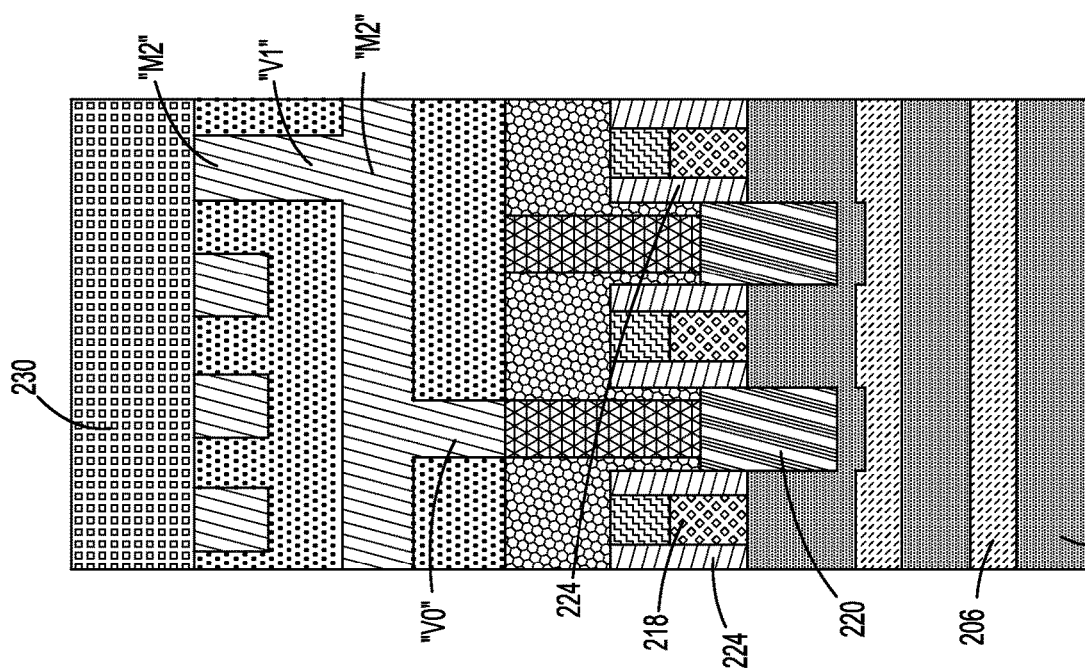
FIG. 19 is a schematic cross-sectional view along the x-axis of the semiconductor structure of FIGS. 17 and 18 at a third stage of fabrication illustrating formation of the source and drain regions, the gate structures and the gate spacers, and formation of one or more BEOL devices according to one or more illustrative embodiments.

Referring now to FIGS. 19 and 20, gate structures 218, source and drain regions 220, gate spacers 224 and fin spacers 226 are formed in the manner described hereinabove. A BEOL device 228 is developed on the upper surface of the dielectric layer. Additional BEOL devices 230 also may be formed on the BEOL device 228.

Figure 22:
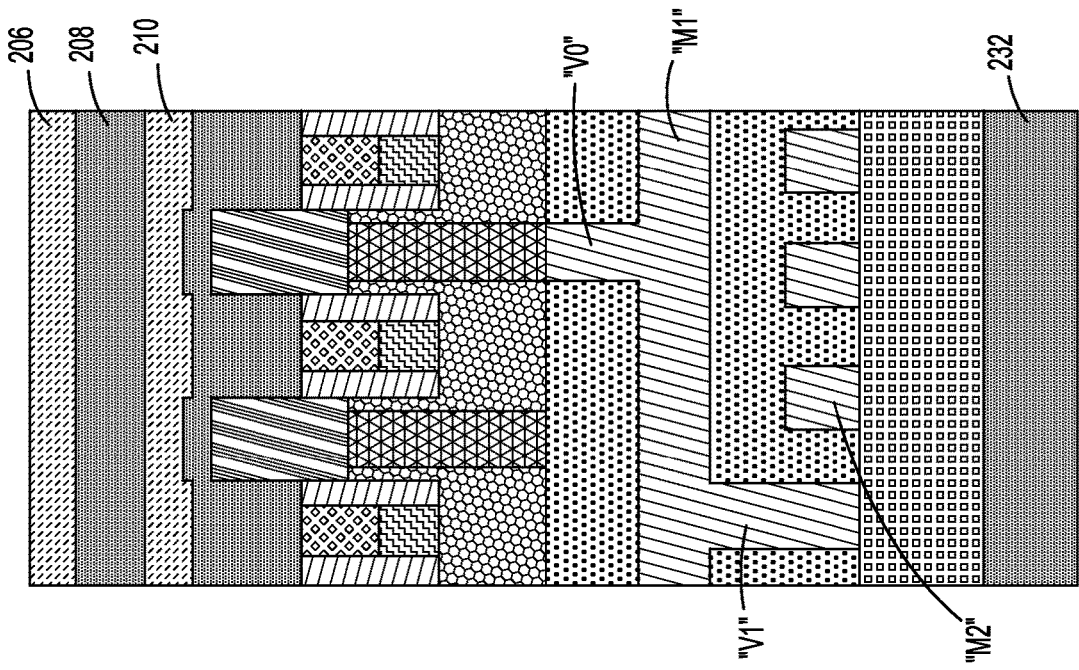
FIG. 22 is a schematic cross-sectional view along the x-axis of the semiconductor structure of FIGS. 17-21 at the fourth intermediate stage of fabrication according to one or more illustrative embodiments.
Figure 21:
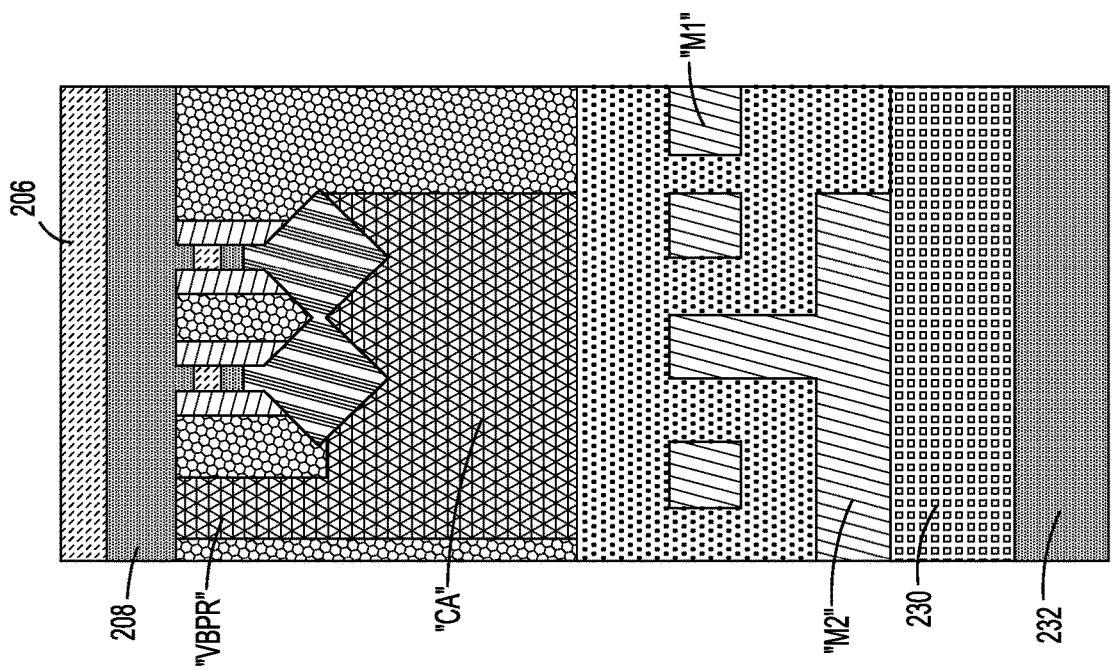
FIG. 21 is a schematic cross-sectional view along the y-axis of the semiconductor structure of FIGS. 17-20 at a fourth intermediate stage of fabrication illustrating rotation of the semiconductor structure, removal of the semiconductor substrate and formation of a bonding wafer on the BEOL device according to one or more illustrative embodiments.
Figure 24:
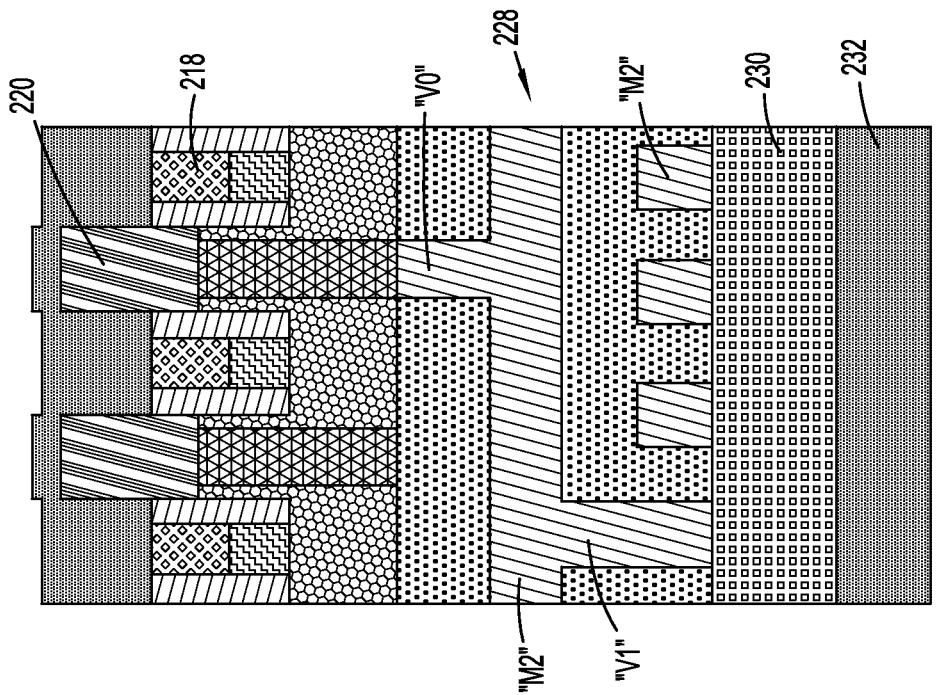
FIG. 24 is a schematic cross-sectional view along the x-axis of the semiconductor structure of FIGS. 17-23 at the fifth intermediate stage of fabrication according to one or more illustrative embodiments.
Figure 23:
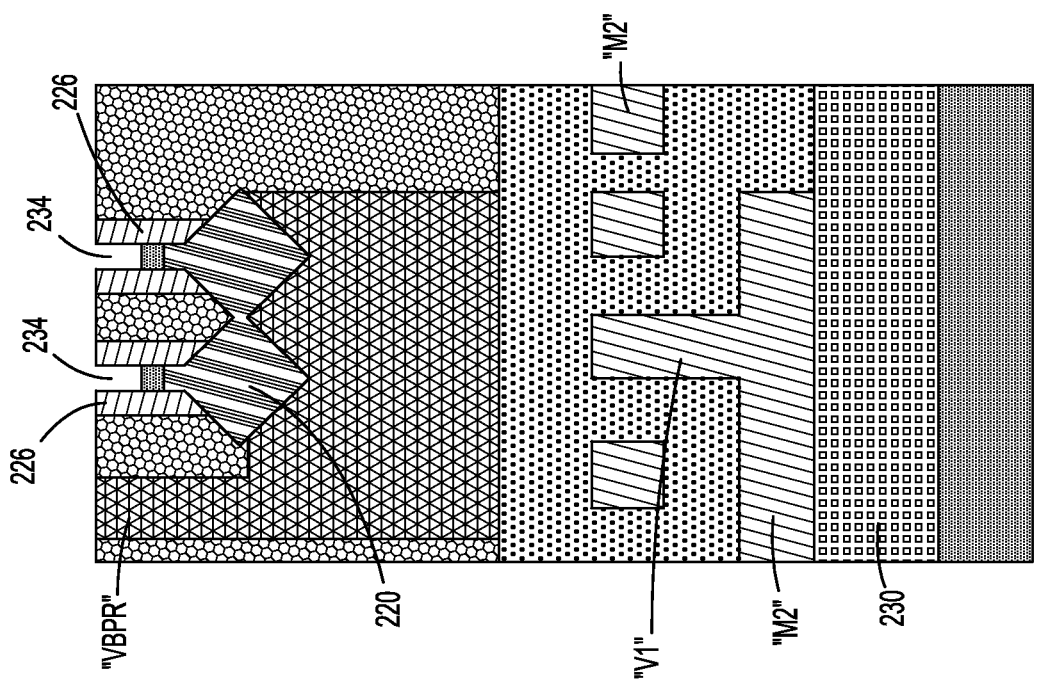
FIG. 23 is a schematic cross-sectional view along the y-axis of the semiconductor structure of FIGS. 17-22 at a fifth intermediate stage of fabrication illustrating removal of the remaining portions of the substrate to expose the fin airgap spacers.

With reference to FIGS. 21 and 22, a bonding wafer 232 is formed on, or bonded to, the BEOL devices 230, and after rotating or flipping the semiconductor structure 200, the first substrate level 204 of silicon is removed via one or more etching process selective to the silicon germanium material of the second substrate level 206. With reference to FIGS. 23 and 24, the second substrate level 206 formed of silicon germanium, the third substrate level 208 formed of silicon and the fourth substrate level 210 formed of silicon germanium are selectively removed. In illustrative embodiments, removal of the fourth substrate level 210 formed of silicon germanium exposes the fin spacers 226 and the gate spacers 224 via recesses 234. The process is completed by removing the spacers 224, 226 to form gate airgap spacers and fin airgap spacers in the manner described hereinabove. Thereafter, a dielectric is formed with an integral power distribution network, including backside power rail(s) BPRs, via contacts and additional backside metal lines formed over the via contacts.

While exemplary methods are discussed herein in the context of FinFET devices, those of ordinary skill in the art can readily envision the implementation of the same or similar methods to form overlapping source and drain and gate contacts for planar FET devices having metal gate structures. Further, it is to be understood that the methods discussed herein for fabricating FinFET devices with gate contacts formed in active regions overlapping source and drain contacts can be incorporated as part of various semiconductor processing flows for fabricating other types of semiconductor devices and integrated circuits with various analog and digital circuitry or mixed-signal circuitry. The integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

What is claimed is:

1. A semiconductor structure, comprising:
  a field effect transistor disposed on a substrate, the field effect transistor including:
    a vertical fin extending from the substrate;
    source and drain regions separated by a gate region;
    a gate structure disposed over the gate region; and
    a gate airgap spacer at least partially disposed about the gate structure; and
  a back end of the line device disposed over the gate structure.

2. The semiconductor structure according to claim 1 including a plurality of gate structures, each gate structure having a gate airgap spacer at least partially disposed therearound.

3. The semiconductor structure according to claim 1 wherein the vertical fin is at least partially surrounded by a fin airgap spacer.

4. The semiconductor structure according to claim 3 wherein the fin airgap spacer extends to the substrate.

5. The semiconductor structure according to claim 1 wherein the back end of the line device is coupled to the field effect transistor.

6. The semiconductor structure according to claim 5 including a substrate wafer coupled to the back end of the line device.

7. The semiconductor structure according to claim 6 including a backside power rail and a backside power distribution network coupled to the substrate wafer remote from the back end of the line device.

8. The semiconductor structure according to claim 7 wherein the field effect transistor includes a contact via in electrical contact with one of the source and drain regions.

9. The semiconductor structure according to claim 8 including one or more backside via contacts in communication with the backside power rail.

10. The semiconductor structure according to claim 1 wherein the vertical fin includes a vertical dielectric fin portion and a vertical semiconductor fin portion over the vertical dielectric fin portion.

11. A semiconductor device, comprising:
  a first device formed on a first side of a substrate, the first device including source and drain regions separated by a gate region, a fin and a gate structure disposed over the gate region;
  an airgap spacer extending to a second side of the substrate;
  a second device formed on the second side of the substrate and coupled to the first device; and
  a back end of the line device coupled to the first device and remote from the second device.

12. The semiconductor device according to claim 11 including a gate airgap spacer at least partially disposed about the gate structure.

13. The semiconductor device according to claim 12 wherein the fin is a vertical fin and further including a fin airgap spacer at least partially disposed about the vertical fin.

14. The semiconductor device according to claim 13 wherein the fin airgap spacer extends to the second side of the substrate.

15. The semiconductor device according to claim 14 wherein the vertical fin includes a vertical dielectric fin portion and a vertical semiconductor fin portion over the vertical dielectric fin portion.

16. The semiconductor device according to claim 11 wherein the second device includes a backside power rail and via contacts connecting the backside power rail to the first device.

17. An integrated circuit, comprising:
  a plurality of semiconductor structures, wherein at least one of the plurality of semiconductor structures comprises:
  a field effect transistor disposed on a substrate, the field effect transistor comprising:
    a vertical fin extending from the substrate;
    source and drain regions separated by a gate region;
    a gate structure disposed over the gate region; and
    a gate airgap spacer at least partially disposed about the gate structure; and
  a back end of the line device disposed over the gate structure.

18. The integrated circuit according to claim 17 comprising a plurality of gate structures, each gate structure having a gate airgap spacer at least partially disposed therearound.

19. The integrated circuit according to claim 17 wherein the back end of the line device is coupled to the field effect transistor.

20. The integrated circuit according to claim 19 comprising a substrate wafer coupled to the back end of the line device, and a backside power rail and a backside power distribution network coupled to the substrate wafer remote from the back end of the line device.

* * * * *